(12) United States Patent
Chen et al.

(10) Patent No.: US 9,257,332 B2
(45) Date of Patent: Feb. 9, 2016

(54) THROUGH-ASSEMBLY VIA MODULES AND METHODS FOR FORMING THE SAME

(71) Applicant: Taiwan Semiconductor Manufacturing Company, Ltd., Hsin-Chu (TW)

(72) Inventors: Chih-Hua Chen, Zhubei (TW); Chen-Shien Chen, Zhubei (TW); Ching-Wen Hsiao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/567,027

(22) Filed: Dec. 11, 2014

(65) Prior Publication Data
US 2015/0093881 A1    Apr. 2, 2015

Related U.S. Application Data

(62) Division of application No. 13/352,093, filed on Jan. 17, 2012, now Pat. No. 8,928,114.

(51) Int. Cl.
| | |
|---|---|
| H01L 23/00 | (2006.01) |
| H01L 21/768 | (2006.01) |
| H01L 23/498 | (2006.01) |
| H01L 21/48 | (2006.01) |
| H01L 23/48 | (2006.01) |
| H01L 21/78 | (2006.01) |
| H01L 23/14 | (2006.01) |
| H01L 23/15 | (2006.01) |

(52) U.S. Cl.
CPC .......... *H01L 21/7687* (2013.01); *H01L 21/486* (2013.01); *H01L 21/76898* (2013.01); *H01L 21/78* (2013.01); *H01L 23/481* (2013.01); *H01L 23/49827* (2013.01); *H01L 23/147* (2013.01); *H01L 23/15* (2013.01); *H01L 2924/0002* (2013.01)

(58) Field of Classification Search
None
See application file for complete search history.

(56) References Cited

U.S. PATENT DOCUMENTS

| | | |
|---|---|---|
| 6,281,046 B1 | 8/2001 | Lam |
| 2008/0277800 A1 | 11/2008 | Hwang et al. |
| 2009/0155957 A1 | 6/2009 | Chen et al. |
| 2009/0242252 A1 | 10/2009 | Tanaka |
| 2013/0009322 A1 | 1/2013 | Conn et al. |
| 2013/0182402 A1 | 7/2013 | Chen et al. |

FOREIGN PATENT DOCUMENTS

CN    101315924    12/2008

OTHER PUBLICATIONS

Cheah et al., "A Novel Inter-Package Connection for Advanced Package-on-Package Enabling," IEEE Electronic Components and Technology Conference, May 31, 2011, Jun. 3, 2011, pp. 589-594.

*Primary Examiner* — Yasser A Abdelaziez
(74) *Attorney, Agent, or Firm* — Slater & Matsil, L.L.P.

(57) ABSTRACT

A discrete Through-Assembly Via (TAV) module includes a substrate, and vias extending from a surface of the substrate into the substrate. The TAV module is free from conductive features in contact with one end of each of the conductive vias.

15 Claims, 6 Drawing Sheets

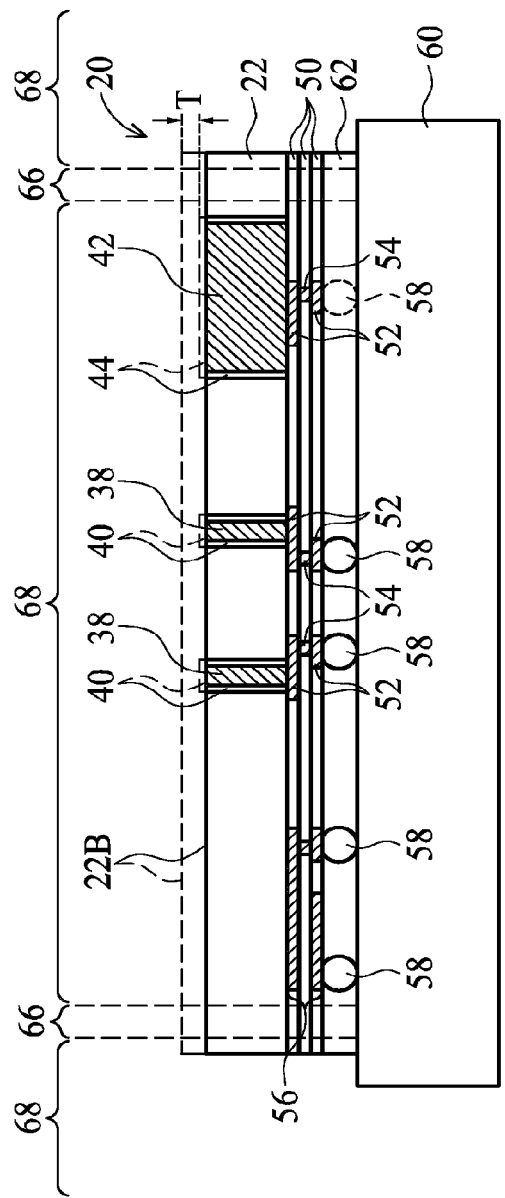
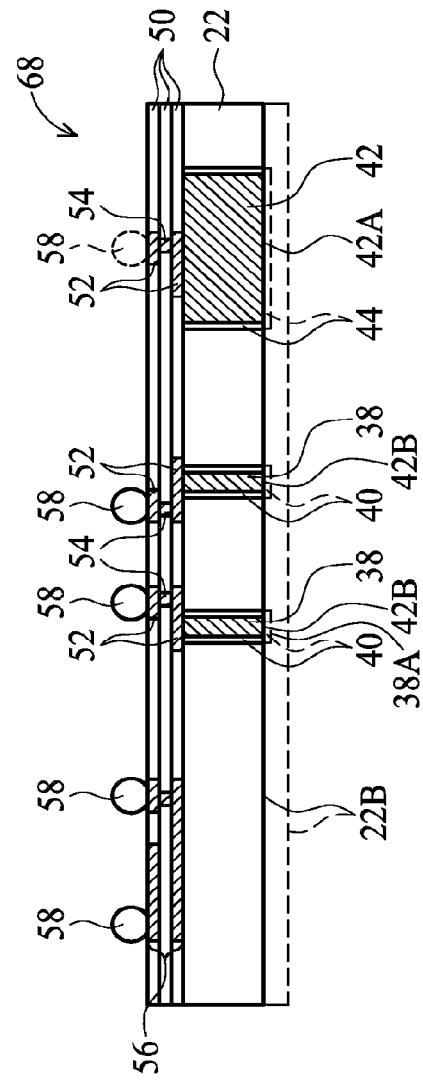
Fig. 5
Fig. 6

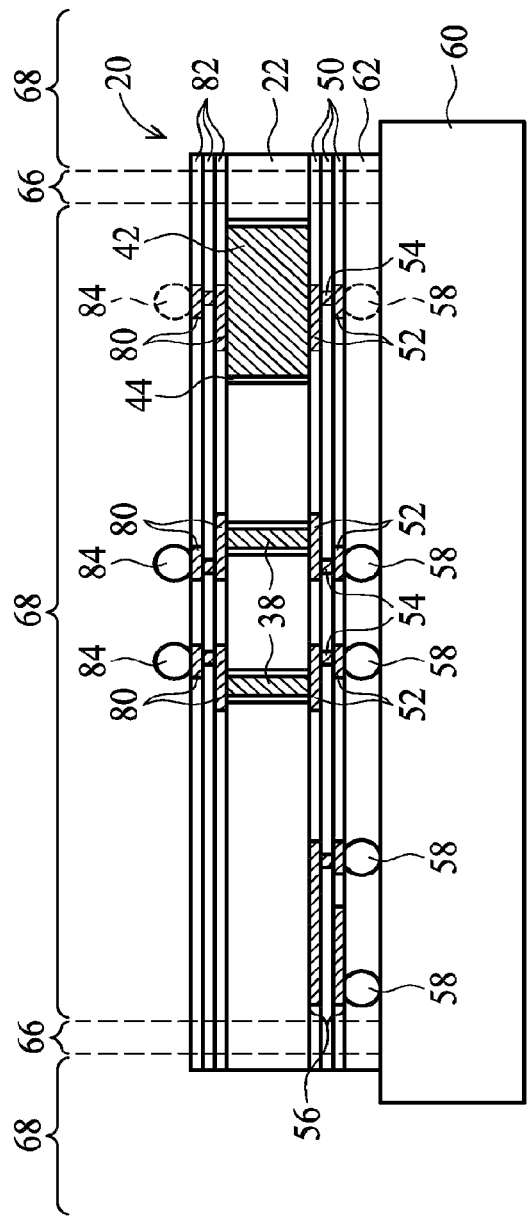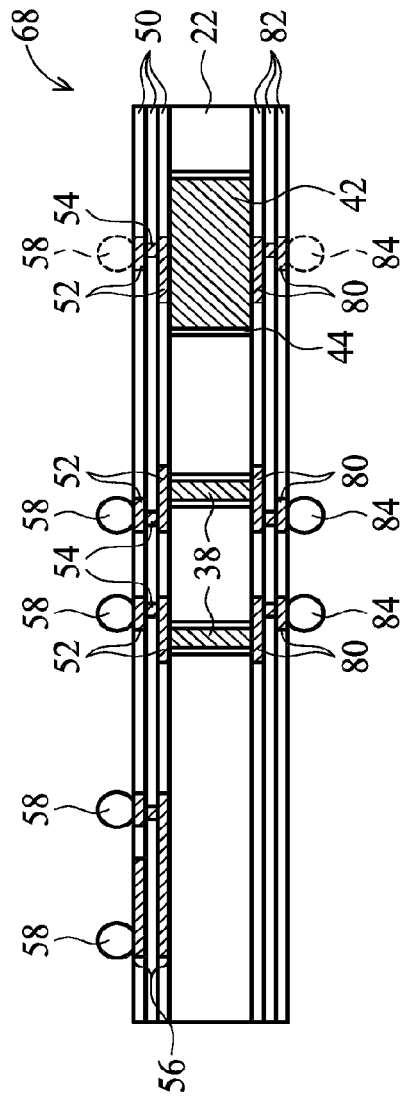
Fig. 7
Fig. 8

THROUGH-ASSEMBLY VIA MODULES AND METHODS FOR FORMING THE SAME

PRIORITY CLAIM AND CROSS-REFERENCE

This application is a divisional of U.S. patent application Ser. No. 13/352,093, entitled "Through-Assembly via Modules and Methods for Forming the Same," filed on Jan. 17, 2012, which application is incorporated herein by reference.

BACKGROUND

The integration density of electronic components (i.e., transistors, diodes, resistors, capacitors, etc.) in integrated circuits has experienced continuous rapid increase. For the most part, the improvement in integration density has come from repeated reductions in minimum feature size, allowing more components to be integrated into a given chip area.

The integration improvement is essentially Two-Dimensional (2D) in nature, in that the volume occupied by the integrated components is essentially on the surface of the semiconductor wafer. Although dramatic improvements in lithography have resulted in considerable improvements in 2D integrated circuit formation, there are physical limitations to the density that can be achieved in two dimensions. One of these limitations is the minimum size needed to make these components. Also, when more devices are put into one chip, more complex designs are required. An additional limitation comes from the significant increase in the number and length of interconnections between devices as the number of devices increases. When the number and length of interconnections increase, both circuit RC delay and power consumption increase.

Three-Dimensional Integrated Circuits (3DICs) were thus developed, wherein dies may be stacked, with wire-bonding, flip-chip bonding, and/or through-silicon vias (TSV) used to connect the dies together and to connect the dies to package substrates.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1A through 9 are cross-sectional views and top views of intermediate stages in the manufacturing of Through-Assembly Via (TAV) modules in accordance with some exemplary embodiments.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Through-Assembly Via (TAV) modules and the methods of forming the same are provided in accordance with various exemplary embodiments. The intermediate stages of forming the TAV modules are illustrated. The variations of the embodiments are discussed. Throughout the various views and illustrative embodiments, like reference numbers are used to designate like elements.

Figure 1A:
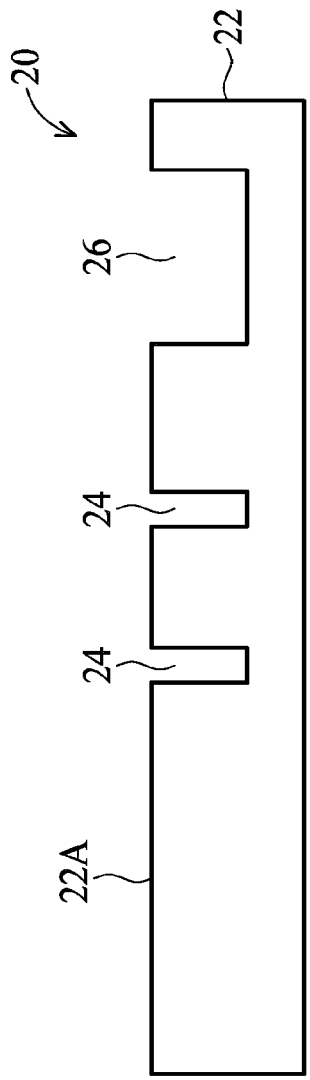

FIGS. 1A through 9 are cross-sectional views and top views of intermediate stages in the formation of TAV modules in accordance with some exemplary embodiments. FIG. 1A illustrates a cross-sectional view of wafer 20, which includes substrate 22. In some embodiments, substrate 22 is a semiconductor substrate, which may further be a crystalline silicon substrate. In alternative embodiments, substrate 22 may include other semiconductor materials such as silicon germanium, silicon carbon, or the like. Substrate 22 may also be a silicon wafer that is formed of crystalline silicon. In yet alternative embodiments, substrate 22 is a dielectric substrate, which may be a glass substrate, for example. Substrate 22 may also be formed of other dielectric materials such as molding compound.

Figure 1B:
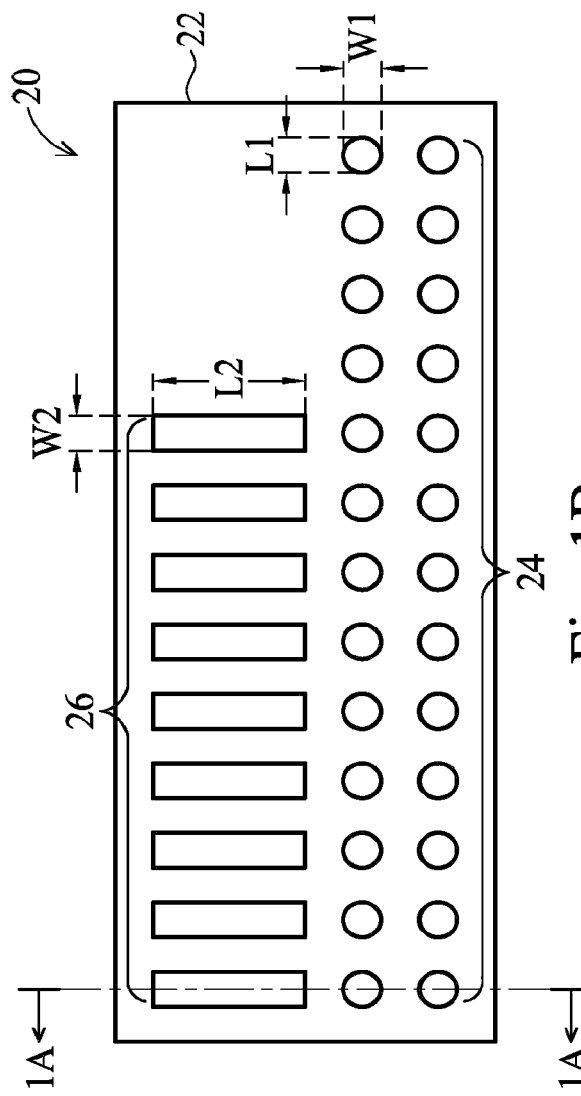

Openings 24 and trenches 26 are formed in substrate 22, and extend from top surface 22A into substrate 22. The forming methods may include etching, laser drilling, and the like. FIG. 1B illustrates a top view of the structure shown in FIG. 1A, wherein the cross-sectional view in FIG. 1A is obtained from the plane crossing line 1A-1A in FIG. 1B. In some embodiments, openings 24 have substantially circular top views. In alternative embodiments, openings 24 have polygon-shaped top views such as squares, hexagons, octagons, or the like, wherein width L1 and width W1 of openings 24 may be close to each other. Trenches 26 may have length L2 greater than width W2. In some embodiments, length L2 and width W2 have ratio L2/W2 greater than about 5.0, for example. It is realized, however, that the dimensions recited throughout the description are merely examples, and may be changed to different values.

Figure 2:
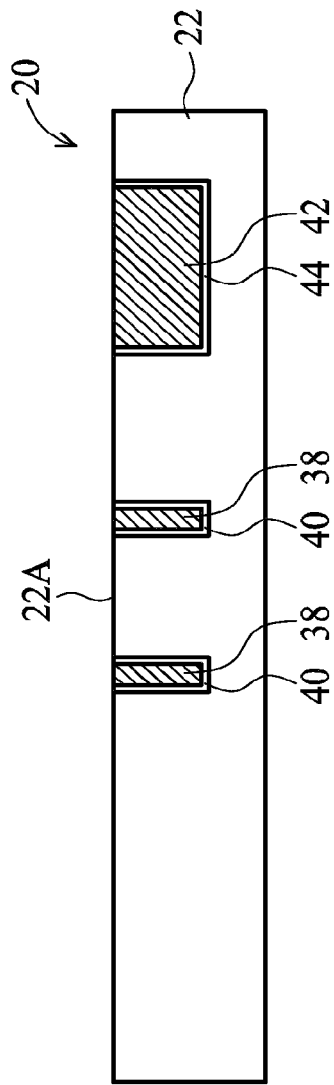

Referring to FIG. 2, through-vias 38 and through-strips 42 are formed in openings 24 and trenches 26, respectively. In the embodiments wherein substrate 22 is a semiconductor substrate, insulation layers 40 may be formed to electrically insulate through-vias 38 from substrate 22. Insulation layers 44 may be, or may not be, formed to electrically insulating through-strips 42 from substrate 22. Insulation layers 40 and 44 may include silicon nitride, silicon oxide, silicon carbide, silicon oxynitride, or the like. In the embodiments wherein substrate 22 is a dielectric substrate, insulation layers 40 and 44 may not be formed, and through-vias 38 and through-strips 42 may be in contact with substrate 22. The materials of through-vias 38 and through-strips 42 may include copper, tungsten, aluminum, and/or the like. In some exemplary embodiments, the formation of insulation layers 40 and 44 (if any) and through-vias 38 and through-strips 42 include blanket forming an insulation layer, and forming a conductive material over the insulation layer, wherein the insulation layer and the conductive material are filled into openings 24 and trenches 26. A Chemical Mechanical Polish (CMP) is then performed to remove excess portions of the insulation layer and the conductive material over top surface 22A of substrate 22. The remaining portions of the insulation layer form insulation layers 40 and 44. The remaining portions of the conductive material form through-vias 38 and through-strips 42.

Figure 3:
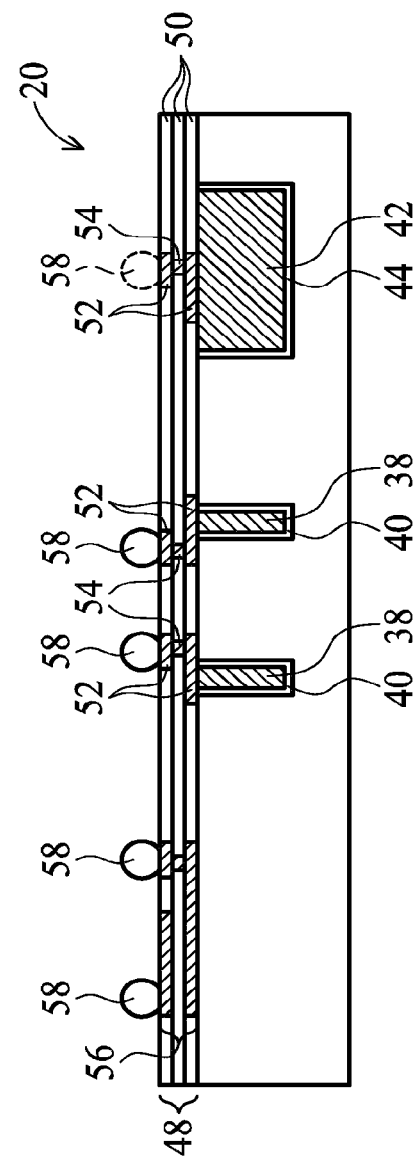

Referring to FIG. 3, interconnect structure 48 is formed over substrate 22. Interconnect structure 48 may include one or a plurality of dielectrics layers 50. In some embodiments, dielectric layers 50 comprise silicon oxide, silicon nitride, silicon carbide, silicon oxynitride, combinations thereof, and/or multi-layers thereof. Alternatively, dielectric layers 50 may include one or more low-k dielectric layer having low k values. The k values of the low-k dielectric materials in dielectric layers 50 may be lower than about 3.0, or lower than about 2.5, for example. Metal lines 52 and vias 54 are formed in dielectric layers 50. Vias 54 are between, and interconnecting, the overlying and underlying metal lines 52. Metal lines 52 are alternatively referred to as Redistribution Lines (RDLs) 52 hereinafter. RDLs 52 are be electrically connected to through-vias 38.

In some embodiments, passive devices such as capacitors, inductors, resistors, and/or the like, are formed in interconnect structure 48. FIG. 3 schematically illustrates exemplary Metal-Insulator-Metal (MIM) capacitor 56, which includes two capacitor plates in two of dielectric layers 50. In alternative embodiments, no passive devices are formed in interconnect structure 48.

Connectors 58 are formed at the top surface of wafer 20. In some embodiments, connectors 58 include solder balls. In alternative embodiments, connectors 58 include metal pillars, wherein solder caps may be, or may not be, formed on the top surfaces of the metal pillars. In yet alternative embodiments, connectors 58 are composite bumps including copper posts, nickel layers, solder caps, Electroless Nickel Immersion Gold (ENIG), Electroless Nickel Electroless Palladium Immersion Gold (ENEPIG), and/or the like. The formation of connectors 58 may include solder ball dropping, plating, reflowing, and/or the like.

Connectors 58 are electrically connected to RDLs 52 and through-vias 38. In accordance with some embodiments, connectors 58 are electrically coupled to through-strips 42 through RDLs 52. In alternative embodiments, some or all of through-strips 42 (please refer to FIG. 9) are not connected to any of RDLs 52 and/or connectors 58. Accordingly, some or all of through-strips 42 may be electrically floating when the respective TAV module 68 (FIG. 9) is packaged, and wherein the respective package is used and powered on.

Figure 4:
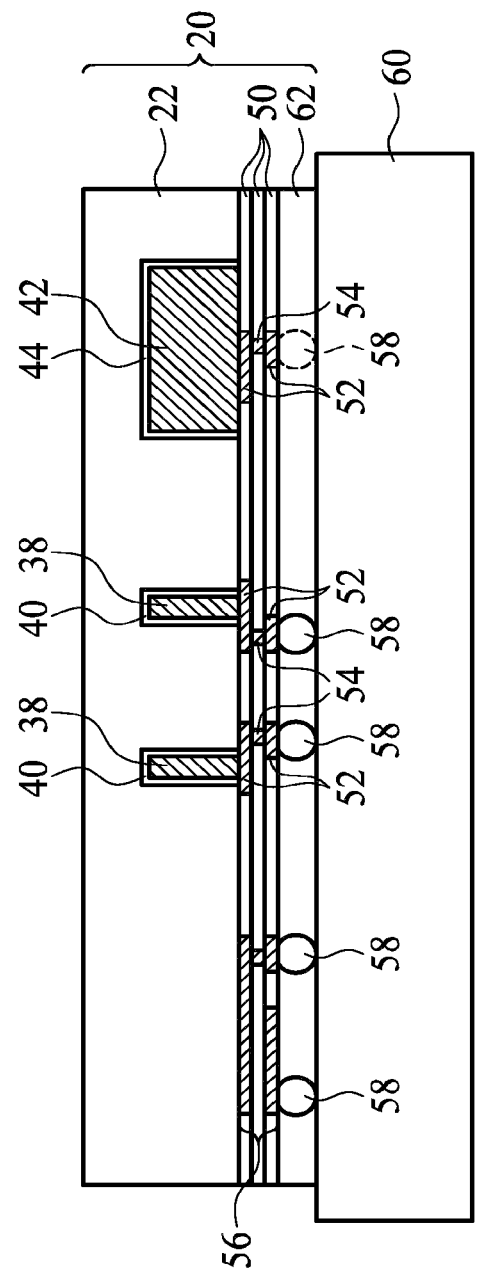

Referring to FIG. 4, wafer 20 is flipped upside down, and is placed over carrier 60. Connectors 58 are adhered to adhesive 62, which is used for mounting wafer 20 onto carrier 60. In some embodiments, carrier 60 is a glass carrier, and adhesive 62 may be an Ultra-Violet (UV) glue. Next, as shown in FIG. 5, a backside grinding is performed on the back surface of substrate 22. In some embodiments, the grinding is performed until through-vias 38 are exposed, wherein the solid lines in FIG. 5 illustrates the back surface 22B of the corresponding substrate 22. In alternative embodiments, the grinding may be ended before insulation layers 40/44 and/or features 38/40 are exposed. The corresponding back surface 22B (after the backside grinding is performed) is illustrated using a dashed line. Accordingly, a thin layer of substrate 22 may be left not grinded, wherein thickness T of the thin layer may be less than about 90 μm, or less than about 50 μm, for example.

In some embodiments, insulation layers 44 and through-strips 42 are exposed after the backside grinding. In alternative embodiments, insulation layers 44 and through-strips 42 are not exposed after the backside grinding. Next, wafer 20 may be demounted from carrier 60, and transferred to a dicing tape (not shown). Wafer 20 is then sawed along scribe lines 66. As a result of the die-saw step, wafer 20 is sawed into a plurality of TAV modules 68, which are also discrete dies that are no longer parts of an un-sawed wafer.

One of discrete TAV modules 68 is illustrated in FIG. 6. In some exemplary embodiments, through-vias 38 have bottom surfaces 38A level with bottom surface of substrate 22. Through-vias 38 and insulation layers 40, if any, are exposed through backside surface 22B of substrate 22. Furthermore, through-strips 42 may have bottom surfaces 42A level with bottom surface of substrate 22. Through-strips 42 and insulation layers 44, if any, are exposed through bottom surface 22B of substrate 22. In alternatively embodiments, in the discrete TAV module 68, the bottom ends 38A of through-vias 38 and the bottom ends 42A of through-strips 42 are buried in substrate 22, and are not in contact with any conductive features. The respective backside surface 22B of substrate 22 is illustrated using a dashed line. In some embodiments, no RDLs 52 and connectors 58 are connected to any through-strips 42. In alternative embodiments, some of RDLs 52 and connectors 58 are connected to some or all of through-strips 42.

In alternative embodiments, as shown in FIG. 7, after the structure in FIG. 5 is formed, and before the demounting of carrier 60, additional RDLs 80, dielectric layer (s) 82, and connectors 84 may be formed. RDLs 80 and connectors 84 may be electrically coupled to through-vias 38. In some embodiments, RDLs 80 and connectors 84 are electrically connected to through-strips 42. In alternative embodiments, through-strips 42 are disconnected from RDLs 80 and connectors 84. Furthermore, through-strips 42 may be disconnected from both RDLs 52 and 80, and hence are electrically floating. In these embodiments, through-strips 42 may be used as thermal conductors for conducting heat from one side of the resulting TAV module 68 to the other side. FIG. 8 illustrates the resulting TAV module 68 after the dicing of wafer 20 in FIG. 7.

Figure 9:
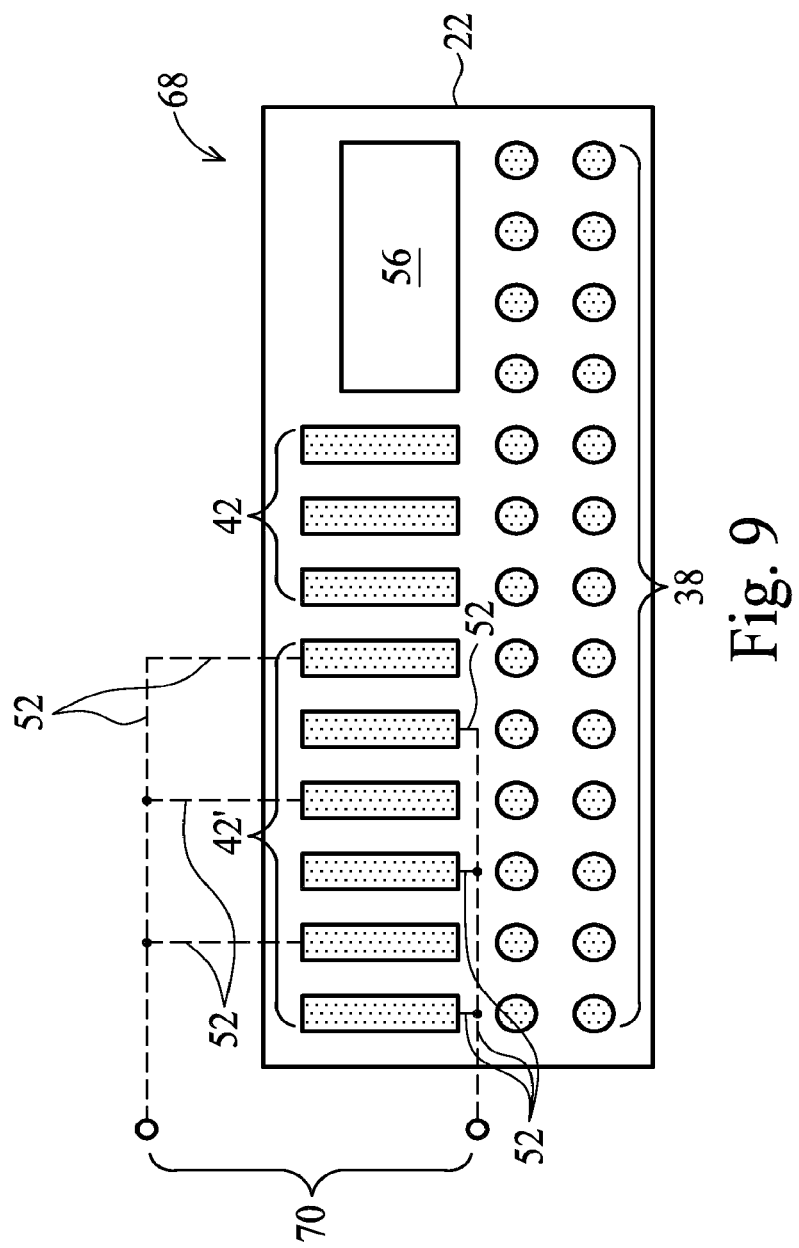

FIG. 9 illustrates a bottom view of TAV module 68 shown in FIGS. 6 and 8. TAV module 68 is a discrete die, which has a rectangular top-view shape having four sides. In some embodiments, through-strips 42 are disconnected from each other. In alternative embodiments, through-strips 42 may be interconnected to form a capacitor. For example, through-strips 42' may be interconnected through RDLs 52 to form one capacitor plate of the resulting capacitor 70. Through-strips 42B" are interconnected through RDLs 52 to form the other capacitor plate of the resulting capacitor 70. Through-strips 42' and through-strips 42" may be laid out in an alternating pattern.

In the embodiments, the formation of TAV modules 68 (FIG. 9) may adopt techniques that are used for forming silicon-based integrated circuits, which techniques include lithography, damascene processes, and the like. Accordingly, a great number of through-vias 38 may be formed in a small chip area. When the TAV modules are used in Three-Dimensional Integrated Circuit (3DIC) packaging, for example, in the formation of Package-on-Package structures, the number of connections between the packages are significantly increased over if solder balls are used as the connections.

In accordance with embodiments, a discrete TAV module includes a substrate, and vias extending from a surface of the substrate into the substrate. The TAV module is free from conductive features in contact with one end of each of the conductive vias.

In accordance with other embodiments, a discrete TAV module includes a substrate comprising a top surface, through-vias penetrating through the substrate, and a plurality of through-strips penetrating through the substrate. The plurality of through-strips has lengthwise directions parallel to each other. The lengths of the plurality of through-strips are greater than the widths of the plurality of through-strips.

In accordance with yet other embodiments, a method includes forming a plurality of through-vias extending from a top surface of a wafer into the wafer, and forming a plurality of through-strips extending from the top surface of the wafer into the wafer. The plurality of through-strips is parallel to each other. The lengths of the plurality of through-strips are greater than the widths of the plurality of through-strips. A plurality of redistribution lines is over and connected to the plurality of through-vias. A backside grinding is performed on a back surface of a substrate in the wafer. The wafer is then sawed into a plurality of dies.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a plurality of through-vias extending from a top surface of a substrate in a wafer into the substrate;
   forming a plurality of through-strips extending from the top surface of the substrate into the substrate, wherein the plurality of through-strips is parallel to each other, and wherein lengths of the plurality of through-strips are greater than widths of the plurality of through-strips;
   forming a plurality of redistribution lines over and connected to the plurality of through-vias;
   performing a backside grinding on a back surface of the substrate; and
   performing a die-saw on the wafer to cut the wafer into a plurality of dies.

2. The method of claim 1 further comprising, before the die-saw, forming electrical connections to interconnect the plurality of through-strips as a capacitor.

3. The method of claim 2, wherein the electrical connections are portions of the plurality of redistribution lines.

4. The method of claim 1, wherein surfaces of the through-vias are exposed after the backside grinding, and the die-saw is performed when the surfaces of the through-vias are exposed.

5. The method of claim 1, wherein after the die-saw, the plurality of through-strips is electrically disconnected from each other.

6. The method of claim 1, wherein the substrate is a dielectric substrate.

7. The method of claim 6, wherein the plurality of through-vias and the plurality of through-strips are in contact with the dielectric substrate.

8. The method of claim 1, wherein the substrate is a semiconductor substrate, and the method further comprises forming insulation layers to separate each of the plurality of through-vias and each of the plurality of through-strips from the semiconductor substrate.

9. A method comprising:
   forming a plurality of through-strips extending from a top surface of a substrate in a wafer into the substrate;
   forming a first plurality of redistribution lines over and connected to the plurality of through-strips, wherein the first plurality of redistribution lines electrically connect the plurality of through- strips as a capacitor; and
   performing a die-saw on the wafer to cut the wafer into a plurality of dies.

10. The method of claim 9 further comprising performing a backside grinding on a back surface of the substrate before the die-saw.

11. The method of claim 10, wherein the backside grinding is stopped before the plurality of through-strips is exposed.

12. The method of claim 9, wherein the substrate is a dielectric substrate, and the plurality of through-strips is in contact with the dielectric substrate.

13. The method of claim 9, wherein the substrate is a semiconductor substrate, and the method further comprises forming insulation layers to separate the plurality of through-strips from the semiconductor substrate.

14. The method of claim 9 further comprising:
   forming a plurality of through-vias extending from a top surface of the substrate into the substrate; and
   forming a second plurality of redistribution lines to electrically connect to the plurality of through-vias, wherein the first and the second plurality of redistribution lines are on opposite sides of the plurality of through-vias.

15. The method of claim 9 further comprising performing a backside grinding on the substrate, wherein the die-saw is performed when the plurality of through-strips is not exposed from a backside of the substrate.

* * * * *